United States Patent [19]

Sim

[11] Patent Number: 5,656,946
[45] Date of Patent: Aug. 12, 1997

[54] MODE-SELECTABLE VOLTAGE DRIVING CIRCUIT FOR USE IN SEMICONDUCTOR MEMORY DEVICE

[75] Inventor: Jai-Hoon Sim, Gunpo, Rep. of Korea

[73] Assignee: Samsung Electronics Co., Ltd., Suwon, Rep. of Korea

[21] Appl. No.: 590,301

[22] Filed: Jan. 23, 1996

[30] Foreign Application Priority Data

Jan. 23, 1995 [KR] Rep. of Korea .................... 1100/95

[51] Int. Cl.$^6$ ............................................... H03K 17/16
[52] U.S. Cl. ............................ 326/21; 365/229; 326/34
[58] Field of Search ............................ 365/228–229; 326/21, 31, 33–34

[56] References Cited

U.S. PATENT DOCUMENTS

| | | | |
|---|---|---|---|
| 4,337,524 | 6/1982 | Parkinson | 365/229 |
| 4,422,163 | 12/1983 | Oldenkamp | 365/229 |
| 5,274,828 | 12/1993 | McAdams | 395/750 |
| 5,278,798 | 1/1994 | Miyawaki | 365/229 |
| 5,408,144 | 4/1995 | Sakata et al. | 326/21 |
| 5,416,747 | 5/1995 | Ohira | 365/230.06 |
| 5,541,885 | 7/1996 | Takashima | 365/229 X |

FOREIGN PATENT DOCUMENTS

| | | |
|---|---|---|
| 0 051 533 | 5/1982 | European Pat. Off. . |
| 0 144 710 | 6/1985 | European Pat. Off. . |
| 0 175 099 | 3/1986 | European Pat. Off. . |
| 0 187 369 | 7/1986 | European Pat. Off. . |
| 0 440 204 A2 | 8/1991 | European Pat. Off. . |

*Primary Examiner*—David R. Hudspeth
*Attorney, Agent, or Firm*—Cushman Darby & Cushman, IP Group of Pillsbury Madison & Sutro LLP

[57] ABSTRACT

A voltage driving circuit for use in a semiconductor memory device. The voltage driving circuit includes a generator which generates a first voltage for an operating mode of the device, a generator which generates a second voltage for a standby mode, and a pair of switches connected between the voltage generators and an operating circuit, for selectively supplying the first and second voltages thereto. The first and second switches each have a control terminal, both of which are commonly coupled to a mode signal, for allowing external control of the voltage selection. The first and second voltages are preferably set relative to each other so as to reduce the subthreshold leakage current consumed by the semiconductor memory during a standby mode, while maintaining a desired operating speed during an operating mode.

26 Claims, 4 Drawing Sheets

5,656,946

MODE-SELECTABLE VOLTAGE DRIVING CIRCUIT FOR USE IN SEMICONDUCTOR MEMORY DEVICE

BACKGROUND OF THE INVENTION

1. Field of the Invention

The present invention relates to a voltage driving circuit for use in a semiconductor memory device, and more particularly, to a circuit capable of selectively driving different voltages according to different modes of the device.

2. Description of the Related Art

In general, to guarantee the reliability of MOS transistors used in semiconductor memory devices, the power supply voltage of the device is kept as low as possible. Likewise, to operate MOS transistors at high speed, their threshold voltage should also be kept low. In particular, the threshold voltage of MOS transistors should be below $\frac{1}{4}$ $V_{CC}$ to prevent their operating speeds from being too low. For example, when the power supply voltage is 1.5 V, the MOS transistor threshold voltage should be below 0.4 V.

Conversely, to eliminate subthreshold leakage current in a MOS transistor, its threshold voltage should be set above 0.7 V. For example, when a low power supply voltage, i.e., 1.5 V, is used, a leakage current of more than $10^2$–$10^5$ times that of a MOS transistor using a power supply voltage of 5 V is generated. The leakage current increases the amount of standby current consumed by the high density semiconductor memory device during its standby mode.

SUMMARY OF THE INVENTION

Therefore, it is an object of the invention to provide a voltage driving circuit capable of selectively providing voltages of different potential according to selected modes in a high density semiconductor memory device.

It is another object of the invention to provide a voltage driving circuit which is capable of eliminating subthreshold leakage current generated by MOS transistors in high density semiconductor memory devices.

It is still another object of the invention to provide a voltage driving circuit which is capable of ensuring high speed memory operations of MOS transistors in high density semiconductor memory devices.

In order to achieve these objects and others, a voltage driving circuit according to the present invention includes a generator which generates a first voltage for an operating mode of the device, a generator which generates a second voltage for a standby mode, and a pair of switches connected between the voltage generators and an operating circuit, for selectively supplying the first and second voltages thereto. The first and second switches each have a control terminal, both of which are commonly coupled to a mode signal, for allowing external control of the voltage selection. The first and second voltages are preferably set relative to each other so as to reduce the subthreshold leakage current consumed by the semiconductor memory during a standby mode, while maintaining a desired operating speed during an operating mode.

BRIEF DESCRIPTION OF THE DRAWINGS

The above and other objects, advantages and features of the present invention will be more apparent from the following detailed description taken together with the attached drawings in which.

DETAILED DESCRIPTION OF THE PREFERRED EMBODIMENT

Figure 1A:
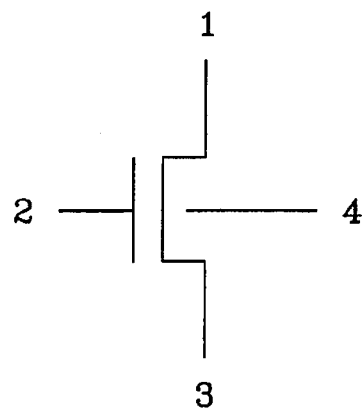
FIG. 1A shows the symbol of a MOS transistor and FIGS. 1B and 1C illustrate characteristics between current $I_{DS}$ and voltage $V_{GS}$ in the MOS transistor shown in FIG. 1A.
Figure 1B:
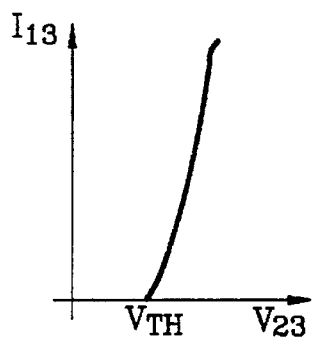
Figure 1C:
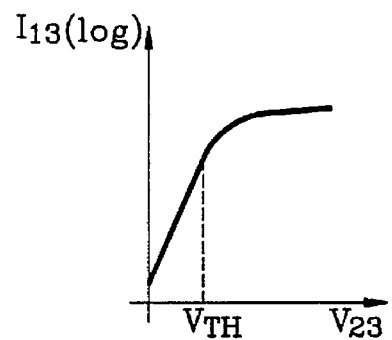

FIG. 1A shows the symbol of an NMOS type of MOS transistor. The reference numerals indicate a drain electrode 1, a gate electrode 2, a source electrode 3, and a substrate 4. FIGS. 1B and 1C illustrate a relationship between the current $I_{13}$ flowing into the source electrode from the drain electrode, and the voltage $V_{23}$ between the gate electrode and the source electrode in the NMOS transistor, wherein FIG. 1B is shown in a linear scale and FIG. 1C in a logarithmic scale.

In accordance with the current and voltage characteristics shown in FIGS. 1B and 1C, the threshold voltage $V_{TH}$ of the MOS transistor can be given by the following equation (1).

$$V_{TH} = V_{TH0} + \gamma[\sqrt{2\Phi_F + |V_{34}|} - \sqrt{2\Phi_F}] - \Delta V_{13} \tag{1}$$

In equation (1), $V_{TH0}$ is the threshold voltage of a long channel, $\gamma$ is a body effect coefficient, $\Phi_F$ denotes a quasi fermi potential, and $\Delta V_{13}$ indicates a drain-induced-barrier lowering coefficient.

In an NMOS transistor such as depicted by FIG. 1A, assuming that the $V_{CC}$ is equal to $V_1$, $V_{SS}$ is equal to $V_4$, and that $V_3$ is changed to $V_{SS2}$ from $V_{SS1}$, the corresponding change in threshold voltage is given by the following equation (2).

$$\Delta V_{TH} = \tag{2}$$
$$\gamma[\sqrt{2\Phi_F + (V_{SS1} - V_{SS})} - \sqrt{2\Phi_F + (V_{SS2} - V_{SS})}] + \Delta(V_{SS1} - V_{SS2})$$

Similarly, in a PMOS transistor, assuming that the $V_{SS}$ is equal to $V_3$, $V_{CC}$ is equal to $V_4$, and that $V_1$ is changed to $V_{CC2}$ from $V_{CC1}$, the corresponding change in threshold voltage is given as an equation (3).

$$\Delta V_{TH} = \gamma[\sqrt{2\Phi_F + |V_{CC2} - V_{CC}|} - \tag{3}$$
$$\sqrt{2\Phi_F + |V_{CC1} - V_{CC}|}] + \Delta(V_{CC1} - V_{CC2})$$

In the above equations (2) and (3), $V_{CC}$, $V_{SS}$, $V_{CC1}$, $V_{SS1}$, $V_{CC2}$, and $V_{SS2}$ can represent any voltage level. Therefore, it is possible to reduce the leakage current by changing the threshold voltages of the NMOS and PMOS transistors according to the relationship of these voltages.

Figure 2A:
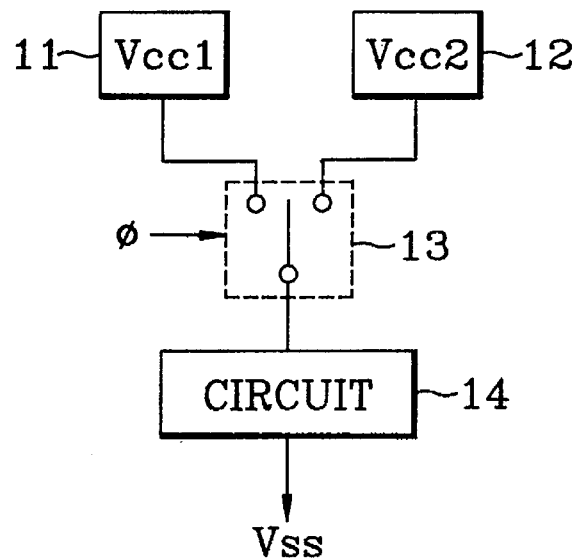
FIG. 2A is a diagram illustrating one construction of a first voltage driving circuit according to the present invention, FIG. 2B a second voltage driving circuit, and FIG. 2C a third voltage driving circuit.

As discussed above, by controlling the voltages provided to the semiconductor memory transistors according to a plurality of voltage modes, the leakage current of the transistors can be reduced. FIG. 2A shows one construction of a first voltage driving circuit according to the present invention. In the voltage driving circuit such as that shown in FIG. 2A, a first power supply voltage generator 11 generates a first power supply voltage $V_{CC1}$, and a second power supply voltage generator 12 generates the second power supply voltage $V_{CC2}$ which is lower than the first power supply voltage $V_{CC1}$. If the first power supply voltage $V_{CC1}$ is established as external power supply voltage $V_{CC}$, the second power supply voltage $V_{CC2}$ can be established as internal power supply voltage. If the first power supply voltage $V_{CC1}$ is established as the internal power supply voltage, the second power supply voltage $V_{CC2}$ can be established as any voltage lower than the internal power supply voltage. That is, the first power supply voltage $V_{CC1}$ can have a power supply voltage of more than $V_{HT}+\alpha$ and the second power supply voltage $V_{CC2}$ can have any level greater than that of $V_{TH}$ which is capable of maintaining the logic state of a circuit 14.

The first power supply voltage $V_{CC1}$ output from the first power voltage generator 11 and the second power supply voltage $V_{CC2}$ from the second power voltage generator 12 are both input to a switch circuit 13. A mode control signal φ is input to the terminals of the switch circuit 13, and according to the modes selected thereby, the first and second power supply voltages $V_{CC1}$ and $V_{CC2}$ are selected and then output to the circuit 14.

Figure 3:
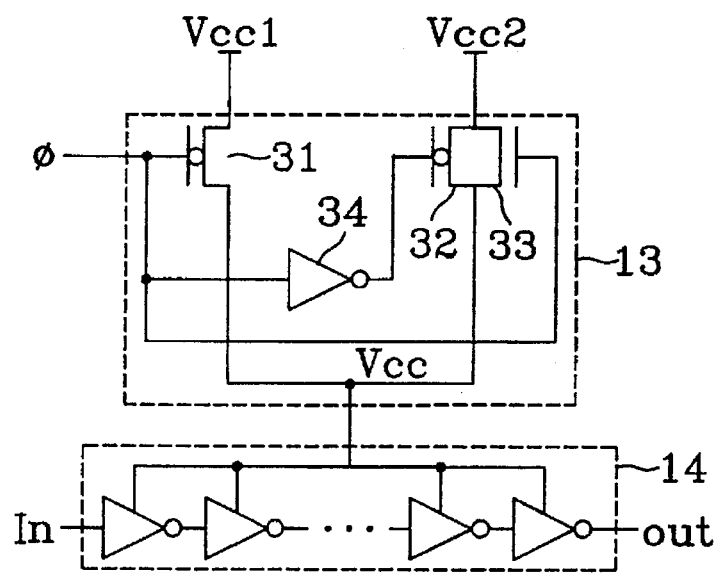
FIG. 3 is a circuit diagram showing one embodiment of the first voltage driving circuit shown in FIG. 2A.
Figure 4:
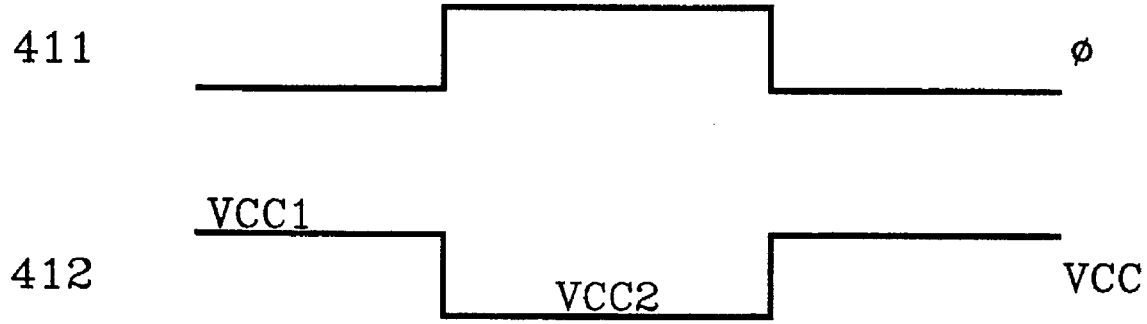
FIG. 4 is a waveform diagram illustrating operation characteristics of the first voltage driving circuit shown in FIG. 3.

FIG. 3 shows one embodiment of the first voltage driving circuit shown in FIG. 2A and FIG. 4 is a waveform diagram illustrating operational characteristics of the circuit FIG. 3. Reference numeral 411 indicates the mode control signal φ which is defined as a signal for selecting either a standby mode or a normal mode. For example, the signal φ can use a row address strobe RAS in a dynamic random access memory device, a chip selection signal CS in a static random access memory device, or a chip enable signal CE in a nonvolatile memory device. The first and second power supply voltages $V_{CC1}$ and $V_{CC2}$, as mentioned above, are generated by the first and second power supply voltage generators 11 and 12. A PMOS transistor 31 whose gate electrode is coupled with the mode control signal φ is connected between the first power supply voltage $V_{CC1}$ and the circuit 14. An inverter 34 inverts and outputs the inverted mode control signal φ. A PMOS transistor 32 whose gate electrode is coupled with an output terminal of the inverter 34 is connected between the second power supply voltage $V_{CC2}$ and the circuit 14. An NMOS transistor 33 whose gate electrode is coupled with the mode control signal φ is connected between the second power supply voltage $V_{CC2}$ and the circuit 14.

The above construction corresponds to the switch circuit 13 of FIG. 2A. Therefore, if the mode control signal φ representing an operating mode in FIG. 4 is inputted at the logic "low" level, the PMOS transistor 31 is turned on and the NMOS transistor 33 is turned off. Further, the PMOS transistor 32 is turned off by the inverter 34. Thus, if the PMOS transistor 31 is turned on, the first power supply voltage $V_{CC1}$ output from the first power supply voltage generator 11 is provided to the circuit 14, as shown by the reference numeral 412 in FIG. 4. When the PMOS transistor 32 and the NMOS transistor 33 are turned off, a path of the second power supply voltage $V_{CC2}$ is blocked. Accordingly, during the operating mode, the circuit 14 inputs the first power supply voltage $V_{CC1}$ as an operating power supply voltage to perform its function.

Thereafter, if the mode control signal φ is changed to the logic "high" level, the PMOS transistor 31 is turned off and the NMOS transistor 33 is turned on. Further, the PMOS transistor 32 is turned on by the inverter 34. Hence, when the PMOS transistor 32 and the NMOS transistor 33 are turned on, the second power supply voltage $V_{CC2}$ output from the second power supply voltage generator 12 is provided to the circuit 14, as shown by the reference numeral 412 in FIG. 4. Because the PMOS transistor 31 is turned off, a path of the first power supply voltage $V_{CC1}$ is blocked. Accordingly, during the standby mode, the circuit 14 inputs the second power supply voltage $V_{CC2}$ as an operating power supply voltage to thereby maintain a corresponding state.

Figure 2B:
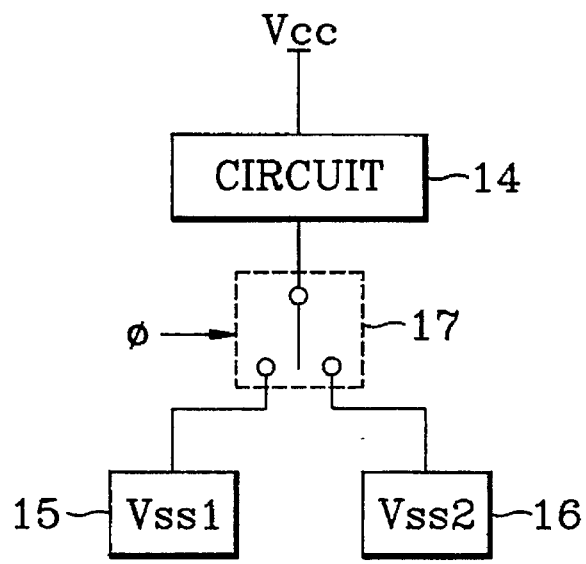

FIG. 2B shows construction of a second voltage driving circuit according to the present invention. A first ground voltage generator 15 generates a first ground voltage $V_{SS1}$. A second ground voltage generator 16 generates a second ground voltage $V_{SS2}$ which is higher than the first ground voltage $V_{SS1}$. If the first ground voltage $V_{SS1}$ is established as external ground voltage $V_{SS}$, the second ground voltage $V_{SS2}$ can be established as internal ground voltage $V_{SS}$. On the other hand, if the first ground voltage $V_{SS1}$ is established as the internal ground voltage $V_{SS}$, the second ground voltage $V_{SS2}$ can be established as any voltage higher than the internal ground voltage $V_{SS}$. That is, the first ground voltage $V_{SS1}$ can have a voltage of 0 V and the second ground voltage $V_{SS2}$ can have a voltage greater than $V_{CC}-V_{TH}-\alpha$. The first ground voltage $V_{SS1}$ output from the first ground voltage generator 15 and the second ground supply voltage $V_{SS2}$ from the second ground voltage generator 16 are both input to the switch circuit 17. The mode control signal is input to the terminals of the switch circuit 17, and according to the modes selected thereby, the first and second ground supply voltages $V_{SS1}$ and $V_{SS2}$ are selected and then output to the circuit 14.

Figure 2C:
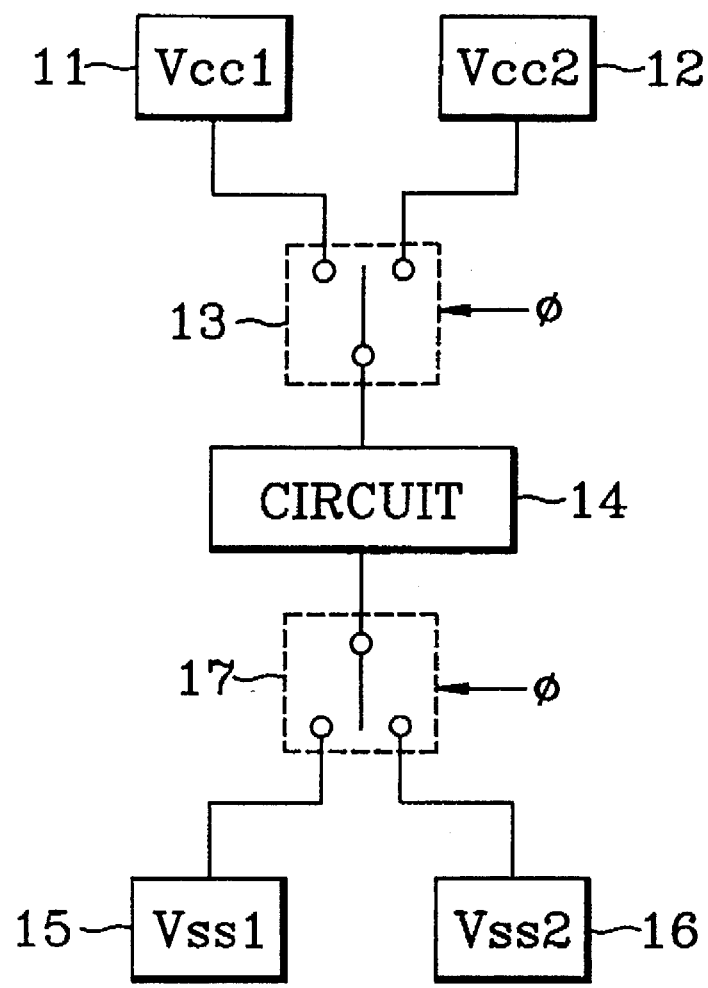

FIG. 2C shows construction of a third voltage driving circuit using the first and second power supply voltages $V_{CC1}$ and $V_{CC2}$ of FIG. 2A and the first and second ground voltages $V_{SS1}$ and $V_{SS2}$ of FIG. 2B. Here, for example, the first power supply voltage $V_{CC1}$ can have a power supply voltage greater than that of an internal power supply voltage, the second power supply voltage $V_{CC2}$ a power supply voltage of $\frac{3}{2}(V_{TH}+\alpha)$, the first ground voltage $V_{SS1}$ a voltage of 0 V, and the second ground voltage $V_{SS2}$ a voltage of $\frac{1}{2}(V_{TH}+\alpha)$.

As mentioned in the foregoing description, the present invention is designed to efficiently provide optimal voltages according to the selected mode of the semiconductor memory device. Further, since the present invention selectively drives appropriate voltages to operate the circuit, it is possible to prevent the subthreshold leakage current and to prevent current from being unnecessarily consumed in the standby mode.

Although the present invention has been described above with reference to the preferred embodiment, it will be appreciated by those skilled in the art that various substitutions and modifications can be made without departing from the spirit and scope of the invention as set forth in the appended claims.

What is claimed is:

1. A voltage driving circuit for a semiconductor memory device having an operating mode and a standby mode, comprising:

a first generator which provides a first voltage;

a second generator which provides a second voltage different than said first voltage;

a first switch connected between said first generator and a memory circuit;

a second switch connected between said second generator and said memory circuit; and a control terminal to which is applied a mode signal, said first and second switches being commonly coupled to said control terminal so that said first voltage is supplied to said memory circuit during said operating mode, and said second voltage is supplied to said memory circuit during said standby mode, said memory circuit including MOS transistors, said first and second voltages controlling a threshold voltage of said MOS transistors so that they have a first threshold voltage during said operating mode and a second threshold voltage different than said first threshold voltage during said standby mode.

2. The voltage driving circuit according to claim 1, wherein said second voltage has a level that reduces subthreshold leakage current of said MOS transistors of said memory circuit during said standby mode.

3. The voltage driving circuit according to claim 1, wherein said first and second voltages supply power supply voltages to said memory circuit and said first voltage is higher than said second voltage.

4. The voltage driving circuit according to claim 3, wherein said memory circuit includes PMOS transistors.

5. The voltage driving circuit according to claim 1, wherein said first and second voltages supply ground supply voltages to said memory circuit and said first voltage is lower than said second voltage.

6. The voltage driving circuit according to claim 5, wherein said memory circuit includes NMOS transistors.

7. The voltage driving circuit according to claim 1, wherein said first switch includes at least one MOS transistor.

8. The voltage driving circuit according to claim 1, wherein said second switch includes at least one MOS transistor.

9. The voltage driving circuit according to claim 1, wherein said first threshold voltage of said MOS transistors is set to be below 0.4 Volts during said operating mode, and said second threshold voltage is set to be above 0.7 Volts during said standby mode.

10. The voltage driving circuit according to claim 1, wherein said semiconductor memory device is a nonvolatile memory and said mode signal is a chip enable signal.

11. The voltage driving circuit according to claim 1, wherein said semiconductor memory device is a static random access memory and said mode signal is a chip selection signal.

12. The voltage driving circuit according to claim 1, wherein said semiconductor memory device is a dynamic random access memory and said mode signal is a row address strobe signal.

13. The voltage driving circuit according to claim 3, wherein said first voltage is an external power supply voltage and said second voltage is an internal power supply voltage.

14. The voltage driving circuit according to claim 3, wherein said first and second voltages are internal power supply voltages.

15. The voltage driving circuit according to claim 5, wherein said first voltage is an external ground supply voltage and said second voltage is an internal ground supply voltage.

16. The voltage driving circuit according to claim 5, wherein said first and second voltages are internal ground supply voltages.

17. A voltage driving circuit for a semiconductor memory device having an operating mode and a standby mode, comprising:
a first power supply generator which provides a first power supply voltage;
a second power supply generator which provides a second power supply voltage;
a first switch having
first input terminals coupled to said first and second power supply generators,
a first output terminal coupled to a memory circuit, and
a first control terminal which receives a mode signal, so that said voltage driving circuit supplies said first power supply voltage to said memory circuit during said operating mode, and said second power supply voltage during said standby mode;
a first ground voltage generator which provides a first ground voltage;
a second ground voltage generator which provides a second ground voltage;
a second switch having
second input terminals coupled to said first and second ground voltage generators,
a second output terminal coupled to said memory circuit, and
a second control terminal which receives said mode signal, so that said voltage driving circuit supplies said first ground voltage to said memory circuit during said operating mode, and said second ground voltage during said standby mode.

18. The voltage driving circuit according to claim 17, wherein said second power supply voltage has a level that reduces subthreshold leakage current of said memory circuit during said standby mode.

19. The voltage driving circuit according to claim 18, wherein said first power supply voltage is higher than said second power supply voltage.

20. The voltage driving circuit according to claim 19, wherein said memory circuit includes PMOS transistors.

21. The voltage driving circuit according to claim 17, wherein said second ground voltage has a level that reduces subthreshold leakage current of said memory circuit during said standby mode.

22. The voltage driving circuit according to claim 21, wherein said first ground voltage is lower than said second ground voltage.

23. The voltage driving circuit according to claim 22, wherein said memory circuit includes NMOS transistors.

24. The voltage driving circuit as claimed in claim 17, wherein said first and second switches include at least one MOS transistor, respectively.

25. A voltage driving circuit for a semiconductor memory device having an operating mode and a standby mode, comprising:
a first generator which provides a first voltage;
a second generator which provides a second voltage different than said first voltage;
a first switch connected between said first generator and a memory circuit;
a second switch connected between said second generator and said memory circuit; and
a control terminal to which is applied a mode signal, said first and second switches being commonly coupled to said control terminal so that said first voltage is supplied to said memory circuit during said operating mode, and said second voltage is supplied to said memory circuit during said standby mode, said first and second voltages supplying power supply voltages to said memory circuit, said first voltage being higher than said second voltage, said second voltage having a level that reduces subthreshold leakage current of said memory circuit during said standby mode.

26. A voltage driving circuit for a semiconductor memory device having an operating mode and a standby mode, comprising:

a first generator which provides a first voltage;

a second generator which provides a second voltage different than said first voltage;

a first switch connected between said first generator and a memory circuit;

a second switch connected between said second generator and said memory circuit; and a control terminal to which is applied a mode signal, said first and second switches being commonly coupled to said control terminal so that said first voltage is supplied to said memory circuit during said operating mode, and said second voltage is supplied to said memory circuit during said standby mode, said first and second voltages supplying ground supply voltages to said memory circuit, said first voltage being lower than said second voltage, said second voltage having a level that reduces subthreshold leakage current of said memory circuit during said standby mode.

* * * * *